United States Patent [19]

Conrads et al.

[11] Patent Number: 4,760,342
[45] Date of Patent: Jul. 26, 1988

[54] ELECTROSTATIC INDUCTION PROBE ARRANGEMENT USING SEVERAL PROBES

[75] Inventors: Josef N. Conrads, Hauset, Belgium; Walter Hillen, Aachen, Fed. Rep. of Germany; Peter Quadflieg, Aachen, Fed. Rep. of Germany; Ulrich Schiebel, Aachen, Fed. Rep. of Germany

[73] Assignee: U.S. Philips Corp., New York, N.Y.

[21] Appl. No.: 829,576

[22] Filed: Feb. 14, 1986

[30] Foreign Application Priority Data

Feb. 19, 1985 [DE] Fed. Rep. of Germany ....... 3505615

[51] Int. Cl.⁴ .................... G01N 27/60; G01R 29/12
[52] U.S. Cl. .................... 324/457; 324/452; 324/72.5
[58] Field of Search ........... 324/452, 454, 457, 458, 324/61 P, 72.5, 72; 355/3 CH, 3 TR

[56] References Cited

U.S. PATENT DOCUMENTS

| | | | |
|---|---|---|---|
| 3,852,768 | 12/1974 | Carmichael et al. | 324/72 X |
| 4,134,137 | 1/1979 | Jacobs et al. | 358/293 |
| 4,389,610 | 6/1983 | Schiebel et al. | 324/72.5 |
| 4,470,009 | 9/1984 | Takayanagi et al. | 324/457 X |
| 4,568,873 | 2/1986 | Oyanagi et al. | 324/61 P |

FOREIGN PATENT DOCUMENTS 5737270 3/1982 Japan.
2043271 10/1980 United Kingdom.

Primary Examiner—Reinhard J. Eisenzopf
Assistant Examiner—Jack B. Harvey
Attorney, Agent, or Firm—Thomas A. Briody; Jack E. Haken

[57] ABSTRACT

An electrostatic induction probe arrangement using several probes. The probe electrodes and the screen electrodes surrounding them are fitted to the end faces of a substrate arrangement, and the conducting paths leading to the preamplifiers are arranged in several parallel planes, perpendicular to the end face, in such a way that the signal-conducting paths connected to the probe electrodes are essentially screened by the screen-conducting paths connected to the screen electrodes.

16 Claims, 3 Drawing Sheets

ELECTROSTATIC INDUCTION PROBE ARRANGEMENT USING SEVERAL PROBES

BACKGROUND OF THE INVENTION

The invention relates to an electrostatic induction probe arrangement for determining the charge distribution on an electrically charged surface with several electrostatic induction probes, each of which has a probe electrode surrounded by a screen electrode and which are mounted on a substrate arrangement. Electrostatic induction probe arrangements of this kind may be used for example in X-ray diagnostics for reading out image transducers which convert an X-ray intensity image into a charge image, for example, selenium plates.

Such an electrostatic induction probe arrangement is known from DE-OS 29 48 660. Since the known electrostatic induction probe arrangement is provided with several probes, it can be used to determine the charge distribution on a charged surface faster than by means of only a single probe. The conductors in the known arrangement which are required between the probe electrodes of the individual probes and the high-ohmic preamplifiers allotted to them may however pick up interfering voltages in addition to the actual signal voltages, and it is very difficult to screen these conductors effectively against such interfering voltages.

SUMMARY OF THE INVENTION

The object of the present invention is to design an electrostatic induction probe arrangement of the aforesaid kind in such a way that the signal leads from the probe electrodes to the preamplifiers are better screened against interfering voltages.

This object is achieved in accordance with the invention by disposing the probe electrodes and the screen electrodes on the end face of the substrate arrangement such that the substrate arrangement is provided in a first plane, which is at least approximately perpendicular to the end face, with a signal-conducting path having the potential of the probe electrode, and carries in two planes at each side of the first plane and parallel to it, screening paths which are electrically conducting and connected to the screen electrode.

In the invention the signal-conducting paths run in the first plane, that is to say in a middle plane and the screening paths run in planes parallel thereto on the end faces of the preferably plate-like substrate arrangement, on whose end faces the probe electrodes and screen electrodes are located. In this way the signal-conducting path is screened against external interference sources and also against crosstalk from neighbouring signal-conducting paths.

Crosstalk from neighbouring signal-conducting paths can be additionally reduced by disposing in the first plane on each side of a signal-conducting path two further screening paths which are connected to the same screen electrode. In a further embodiment of the invention the signal-conducting paths are connected to the input and the corresponding screening paths to the output of a voltage follower. When the electrically charged surface is scanned this results in a uniform electric field between the screen electrodes and the probe electrodes; at the same time the input capacitance of the voltage follower is substantially reduced. In another embodiment of the invention the screen electrode on the end face is surrounded by a further screen electrode which is grounded.

In this way even better screening is provided against external interference sources. In a method of fabricating such an electrostatic induction probe arrangement in accordance with the invention, the screen and probe electrodes are made by depositing an electrically conducting layer on the end face of a substrate arrangement provided with conducting-paths in three parallel planes, after which part of the layer is removed in order to form the probe and screen electrodes, which are electrically insulated from each other. For the fabrication of the substrate arrangement two electrically insulated plates are preferably provided on each side with the screening paths and at least one of the two plates is provided on the other side at least with the signal-conducting paths, the plates being finally joined together in such a way that the side provided with the signal-conducting paths lies in the middle. With this method the probe electrodes and the screen electrodes and also the signal-conducting and screening paths connected with them, can be made by photolithographic means, thereby ensuring economic production.

BRIEF DESCRIPTION OF THE DRAWING

The invention is explained below with reference to the following figures.

DESCRIPTION OF THE PREFERRED EMBODIMENTS

Figure 1:
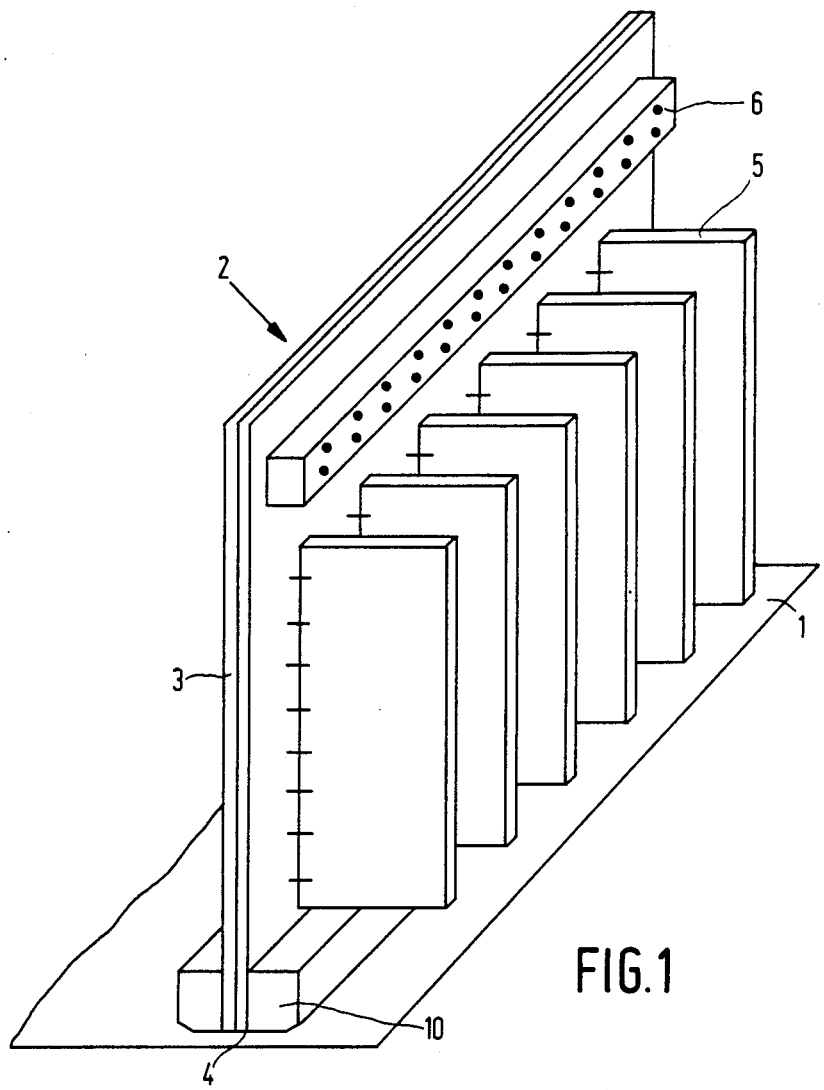
FIG. 1 shows a perspective view of the electrostatic induction probe arrangement.

FIG. 1 shows a plane surface 1 which is electrically charged. The plane surface may belong to an X-ray image transducer, for example, a selenium plate, carrying a charge pattern which corresponds to the intensity distribution of an X-ray image present from a previous exposure. This charge pattern is scanned by an electrostatic induction probe arrangement 2, which at the same time converts the charge at multiple points on the surface 1 into electrical signals. The speed at which the charge distribution on the surface 1 can be scanned—whereby the electrostatic induction probe arrangement 2 and the surface 1 relative to one another, increases with the number of the points whose charge is to be simultaneously detected.

The electrostatic induction probe arrangement comprises for this purpose a plate-like substrate arrangement 3 whose end face runs parallel to the surface to be scanned and at a small distance from it e.g. 100 μm. The end face 4 is provided with probe elctrodes whose potential corresponds to the charge density under these electrodes. The potentials of the individual electrodes are picked up by high-ohmic preamplifiers which are located in hybrid amplifier modules 5 and which are connected via conducting paths on the substrate arrangement 3 to the corresponding probe electrodes. The output signals of the hybrid amplifier modules can be taken off through a low resistance from a multipoint connector 6 where they can be further processed by suitable electronic circuits.

Figure 2:
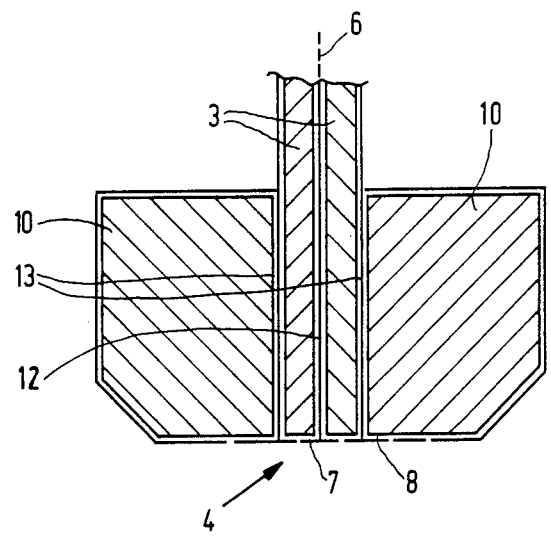
FIG. 2 shows a cross-section through the lower part of the electrostatic induction probe arrangement in a plane perpendicular to the conducting-path planes and to the surface to be scanned.

As can be seen in particular from FIG. 2, which shows the lower part of the electrostatic induction probe arrangement in a section perpendicular to the surface 1 and to the substrate arrangement 2, the substrate arrangement 3 consists of two interconnected planar substrate plates. The substrate plates consist of a highly insulating mechanically stable material, for instance, $Al_2O_3$, and are about 0.5 mm thick.

Figure 3:
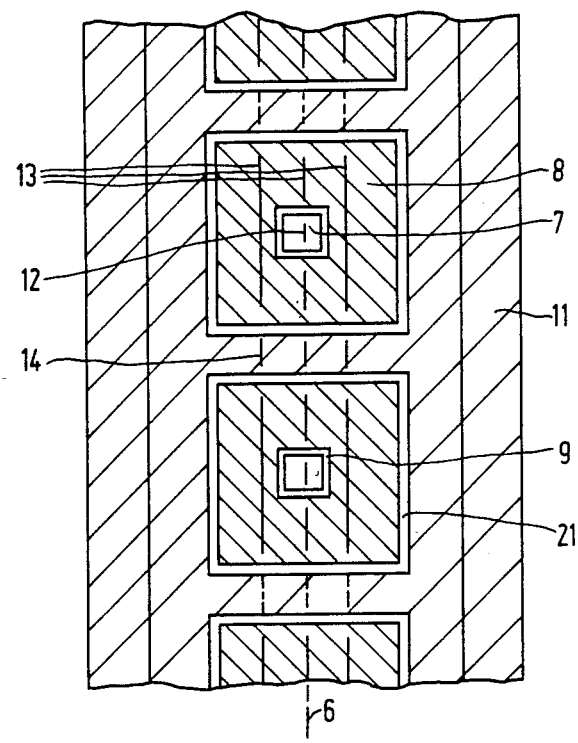
FIG. 3 shows a plan view of the end face of the substrate arrangement.

As FIG. 3 shows, probe electrodes 7 are symmetrically disposed on the lower end face of the substrate plates 3 at regular distances relative to a first plane 6, the middle plane between the two substrate plates 3. The size of these probe electrodes determines the dimensions of the area whose charge is to be detected. A suitable value of the probe electrode surface for the readout of X-ray images is in the region of $150 \times 150$ $\mu$m.

Each probe electrode 7 is surrounded by a screen electrode 8, which is electrically insulated from the probe electrode by a narrow separating gap 9. The screen electrodes 8 are situated in part on the end faces of the substrate arrangement 3, and in part on the lower surfaces of amplifier connectors 10 interfaced with the end faces, which are located in the lower part of the substrate arrangement and which also consist of insulating material. As will be explained in more detail below, they carry the same potential as the probe electrode which they surround, so that during the scanning of the surface 1 a practically uniform electric field is formed between the screen electrode and the probe electrode.

The screen electrodes for their part are surrounded by an electrically conducting, grounded layer 11 which is separated from the screen electrodes by a separating gap 21 and which covers at least the lower surface of the amplifier connector 10.

The probe electrodes 7, the screen electrodes 8 and the layer 11 are connected to conducting paths which are situated on the side faces of the substrate arrangement 3. As appears in particular from FIG. 3, each probe electrode 7 is connected to a signal-conducting path 12, which is located in the middle plane 6 of the substrate arrangement, that is to say on the inner surface of one of the two substrate plates 3. Each screen electrode is connected to several conducting-paths 13. On the one hand these are located on the outer surfaces of the substrate arrangement 3 and, on the other, on the same inner surface as the signal-conducting paths. In this way each signal-conducting path is completely surrounded by several screening paths (cf. FIG. 3). The screening paths on the outside surfaces screen the signal-conducting paths in particular against external interference, while the screening paths in the middle plane 6 are responsible in particular for preventing crosstalk between neighbouring signal-conducting paths. The layer 11 is connected to ground leads 14, which go to the outer surfaces of the substrate arrangement 3.

Figures 4, 5:
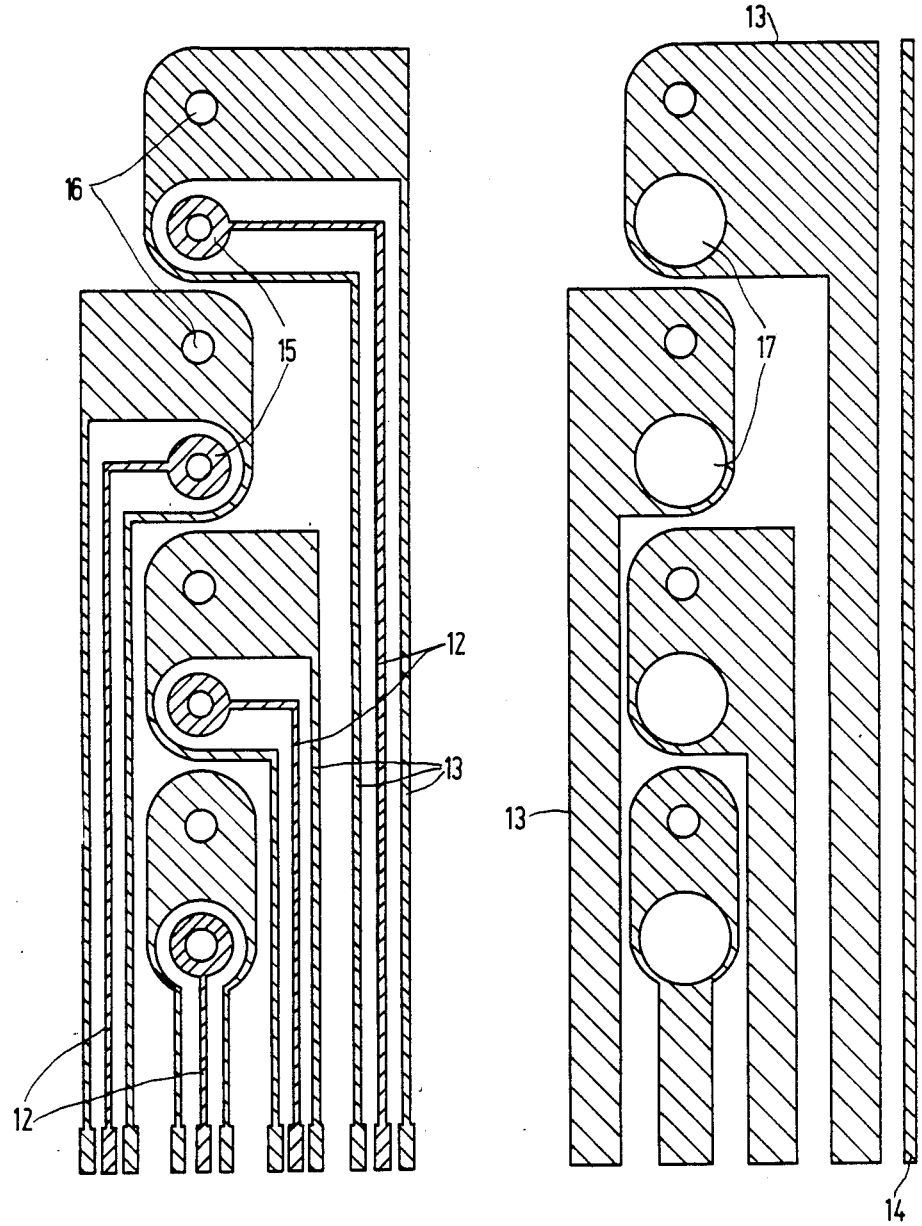
FIG. 4 shows the arrangement of the conducting-paths in the first plane.
FIG. 5 shows the arrangement of the conducting-paths in another plane.

FIG. 4 shows the signal-conducting and screening paths on the inner surface of one of the two substrate plates, and FIG. 5 shows the screening paths and a grounding path on the outer surface of the other substrate plate. As appears from FIG. 4, the signal-conducting paths, the upper end of each of which is connected to an eyelet 15, are so arranged that the connector eyelets of every four signal-conducting paths lie on a straight vertical line. Each signal-conducting path 12 is surrounded by two screening paths 13, which are connected with each other around the connector eyelets of the corresponding conducting path, while the screening path in this region is widened and provided with a connector bore-hole 16.

The arrangement and the shape of the screening paths on the outside surface which lead to the four signal-conducting paths can be seen in FIG. 5. The outer contour of each of these screening paths corresponds to the outer contour of two screen paths 13 leading to one signal-conducting path 12, together with the broadened face. Near the connector eyelets 15 the screening paths have a circular recess 17, whose diameter is larger than the diameter of the connector eyelets 15. Beside these screen paths is further situated the ground lead 14 on the outer surface, one ground lead sufficing in general for the probes on the substrate arrangement 3 and which preferably surrounds the amplifier module (FIG. 1). In FIGS. 4 and 5 the conducting paths leading to groups of four probe electrodes and four screen electrodes continue in the horizontal direction, so that the electrostatic probe arrangement can carry a whole multiple of four probes.

Figure 6:
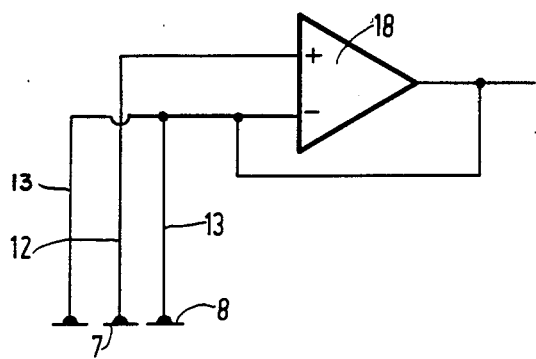
FIG. 6 shows the connection of the probe and screen electrodes with a preamplifier.

FIG. 6 shows schematically the connection of one probe electrode 7 and of the screen electrode 8 surrounding it to an amplifier contained in a module 5. The amplifier is an operational amplifier 18, whose output is connected to the inverting input, resulting in an amplifier with a low-ohmic output and with the voltage gain 1 (voltage follower). The screen electrode 8 is connected via the lead 13 with the inverting input and with the low-ohmic output of the amplifier, and the probe electrode 7 is connected via the signal lead 12 with the non-inverting input of the amplifier. Because of this voltage follower property, the screen electrode 8 assumes the same potential as the signal electrode 7, even when the charge density near the screen electrode differs substantially from that near the signal electrode.

The first step in the fabrication of the electrostatic induction arrangement is to make two aluminium-oxide ceramic plates of the required size. Next the plates are provided with the conducting paths, preferably by a photolithgraphic technique. The one plate with the conductors is thereby provided on both sides and the other plates on the one side—although, where required, on both sides as well—with a gold layer about 6 $\mu$m thick, for example, by vacuum evaporation.

In the next step the screening and ground paths are etched photolithographically, as mirror images, on both ceramic plates as indicated in FIG. 5. Similarly, the signal-conducting and screening paths in accordance with FIG. 4 are etched on the still untreated gold layer of the one ceramic plate and, where appropriate, on the other one as well. The two plates are then stuck together with a suitable adhesive, after which the amplifier connectors 10 are joined to the ceramic plates, preferably in the same way by gluing.

The end face of the substrate arrangement produced by the gluing together of these ceramic plates, and the surface of the amplifier connectors coinciding with the end face, are subsequently flat-ground and polished until the conducting paths become visible under the microscope. On the surface thus treated a gold layer is vapour deposited, which is then in electrical contact with the signal-, screening- and earth-conducting paths. In this layer the separating gaps 9, 21 (FIG. 3) are etched, again photolithographically, resulting in a grounded layer 11 and electrically insulated probe electrodes and screening electrodes 7, 8 which are insulated from said layer and from each other and which are each in contact with the corresponding conducting paths.

Next the bore-holes for the connector eyelets 15 and the recesses 16 are made, so that there are eight bore-holes lying on a straight vertical line in each case. In these bore-holes contact pins are inserted and connected with the surrounding conducting path by means of a suitable electrically conducting adhesive. The pins inserted into the eyelets 15 protrude from the openings 17, without coming into electrical contact with them. With each eight of the contact pins lying on a vertical straight line, as shown in FIG. 1, a hybrid amplifier module is connected, each of which contains four pre-amplifiers. The hybrid amplifier modules 5 can be connected directly with the contact pins. It is more advantageous, however, to apply the hybrid amplifier module 5 together with the plug connector 6 on a circuit board, which is provided with conducting paths for connecting the amplifier output to the plug connector 6 and with sockets for receiving the contact pins.

If the probe electrodes are much closer together, or if the dimensions of the hybrid amplifier module 5 are too large, these modules can be applied to both sides of the substrate arrangement. In the embodiment described thus far the substrate arrangement consists of two ceramic plates, the conducting paths being led to their end face in three planes. The distance between two neighbouring probe electrodes is thereby somewhat larger than the dimensions of a screen electrode, so that per unit length only a relatively small number of probe electrodes may be present. This number can be increased by using more than two substrate plates whose inner and outer surfaces are provided with the conducting-paths, and by disposing the probe electrodes offset one against the other instead of on a straight line.

What is claimed is:

1. Electrostatic induction probe arrangement for determining the charge distribution on an electrically charged surface with several electrostatic induction probes, each of which has a probe electrode surrounded by a screen electrode and which are mounted on a substrate arrangement,
    characterized in that the probe electrode (7) and the screen electrodes (8) are disposed on an end face (4) of the substrate arrangement (3) such that the substrate arrangement is provided in a first plane (6), which is at least approximately perpendicular to the end face, with a signal-conducting path (12) having the potential of the probe electrode (7), and carries in two planes at each side of the first plane and parallel to it, screening paths (13) which are electrically conducting and connected to the screen electrodes (8).

2. Electrostatic induction probe arrangement as claimed in claim 1,
    characterized in that, in the first plane (6) on each side of a signal-conducting path (12) two screening paths (13) are disposed which are connected to the same screen electrode.

3. Electrostatic induction probe arrangement as claimed in either one of the foregoing claims,
    characterized in that, the signal-conducting path (12) is connected to the input and the corresponding screening path (13) to the output of a voltage follower (18).

4. Electrostatic induction probe arrangement as claimed in claim 1,
    characterized in that, the screen electrodes (8) on the end face is surrounded by a further screen electrode (11) which is grounded.

5. Electrostatic induction probe arrangement as claimed in claim 4,
    characterized in that, on both sides of the substrate arrangement additional members (10) are disposed which have a surface running into the end face of the substrate arrangement and which carries at least part of the further screen electrode (11).

6. Electrostatic induction probe arrangement as claimed in claim 4,
    characterized in that, the further screen electrode (11) is connected via at least one conducting-path (14) to ground, leading into at least one of the planes on either side of the first plane.

7. Electrostatic induction probe arrangement as claimed in claim 1,
    characterized in that, the screen and probe electrodes are made by depositing an electrically conducting layer on the end face (4) of a substrate arrangement (3) provided with conducting-paths in three parallel planes, after which a part (9,21) of the layer is removed in order to form the probe and screen electrodes.

8. Electrostatic induction probe arrangement as claimed in claim 7,
    characterized in that, for the fabrication of the substrate arrangement two electrically insulated plates (3) are provided on each side with the screening paths (13) and at least one of the two plates is provided on the other side at least with the signal-conducting paths (12), the plates being finally joined together in such a way that the side provided with the signal-conducting paths lies in the middle.

9. An electrostatic induction probe comprising:
    a substrate comprising a stack of first, second, third, fourth, and fifth substantially planar layers, all of the layers extending parallel to a side plane, the substrate having an end face extending substantially in an end plane which is transverse to the side plane, the third layer being arranged between the second and fourth layers, the second layer being arranged between the first and third layers, the fourth layer being arranged between the third and fifth layers, the first, third, and fifth layers being electrically conducting, the second and fourth layers being electrically insulating;
    a probe electrode arranged on the end face of the substrate, said probe electrode being in electrical contact with the third layer of the substrate; and
    a screen electrode arranged on the end face of the substrate, said screen electrode surrounding the probe electrode, an electrically insulating gap separating the probe electrode from the screen electrode, said screen electrode being in electrical contact with the first and fifth layers of the substrate.

10. An electrostatic induction probe as claimed in claim 9, characterized in that:
    the third substrate layer comprises a first electrically conductive portion arranged between second and third electrically conductive portions, electrically insulating gaps separating the first electrically conductive portion from the second and third electrically conductive portions;

the probe electrode is in electrical contact with the first electrically conductive portion of the third substrate layer; and the screen electrode is in electrical contact with the second and third electrically conductive portions of the third substrate layer.

11. An electrostatic induction probe as claimed in claim 10, characterized in that the end plane is substantially perpendicular to the side plane.

12. An electrostatic induction probe as claimed in claim 11, further comprising a voltage follower having an input and an output, said voltage follower being mounted on the substrate, the input of the voltage follower being electrically connected to the first conductive portion of the third substrate layer, the output of the voltage follower being electrically connected to the second and third conductive portions of the third substrate layer.

13. An electrostatic induction probe array comprising:

a substrate comprising a stack of first, second, third, fourth, and fifth substantially planar layers, all of the layers extending parallel to a side plane, the substrate having an end face extending substantially in an end plane which is transverse to the side plane, the third layer being arranged between the second and fourth layers, the second layer being arranged between the first and third layers, the fourth layer being arranged between the third and fifth layers, the first, third, and fifth layers being electrically conducting, the second and fourth layers being electrically insulating;

a plurality of probe electrodes arranged on the end face of the substrate, said probe electrodes being in electrical contact with the third layer of the substrate; and a plurality of screen electrodes arranged on the end face of the substrate, each screen electrode surrounding one probe electrode, an electrically insulating gap separating each probe electrode from the screen electrode surrounding the probe electrode, each screen electrode being in electrical contact with the first and fifth layers of the substrate.

14. An electrostatic induction probe array as claimed in claim 13, characterized in that:

the third substrate layer comprises a plurality of first electrically conductive portions, each first electrically conductive portion being arranged between second and third electrically conductive portions, electrically insulating gaps separating the first electrically conductive portions from the second and third electrically conductive portions;

each probe electrode is in electrical contact with one first electrically conductive portion of the third substrate layer; and each screen electrode is in electrical contact with one second and one third electrically conductive portion of the third substrate layer.

15. An electrostatic induction probe array as claimed in claim 14, characterized in that the end plane is substantially perpendicular to the side plane.

16. An electrostatic induction probe array as claimed in claim 15, further comprising a plurality of voltage followers, each voltage follower having an input and an output, said voltage followers being mounted on the substrate, the input of each voltage follower being electrically connected to one first conductive portion of the third substrate layer, the output of each voltage follower being electrically connected to one second and one third conductive portion of the third substrate layer.

* * * * *